(12) United States Patent
Song

(10) Patent No.: US 9,129,669 B2
(45) Date of Patent: Sep. 8, 2015

(54) SEMICONDUCTOR DEVICES, SEMICONDUCTOR SYSTEMS INCLUDING THE SAME, AND METHODS OF INPUTTING DATA INTO THE SAME

(71) Applicant: SK hynix Inc., Icheon-si Gyeonggi-do (KR)

(72) Inventor: Keun Soo Song, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/105,471

(22) Filed: Dec. 13, 2013

(65) Prior Publication Data

US 2015/0049559 A1    Feb. 19, 2015

(30) Foreign Application Priority Data

Aug. 16, 2013    (KR) .......................... 10-2013-0097291

(51) Int. Cl.
*G11C 7/06*    (2006.01)
*G11C 7/22*    (2006.01)
*G11C 29/02*    (2006.01)

(52) U.S. Cl.
CPC ............. *G11C 7/222* (2013.01); *G11C 29/022* (2013.01); *G11C 29/023* (2013.01); *G11C 29/028* (2013.01); *G11C 2207/2254* (2013.01)

(58) Field of Classification Search
CPC ........ G11C 29/025; G11C 7/222; G11C 7/22; G11C 8/18; G11C 7/10; G11C 7/1066; G11C 11/4076; G11C 5/04
USPC ............ 365/233.1, 191, 193, 230.06, 233.11, 365/189.05, 189.15
See application file for complete search history.

(56) References Cited

U.S. PATENT DOCUMENTS

2008/0219068 A1*   9/2008   Kim et al. ...................... 365/198
2012/0262998 A1*  10/2012   Kizer et al. .................... 365/193

FOREIGN PATENT DOCUMENTS

KR    1020110100467 A    9/2011
KR    1020110111223 A    10/2011

* cited by examiner

*Primary Examiner* — Thong Q Le
(74) *Attorney, Agent, or Firm* — William Park & Associates Ltd.

(57) ABSTRACT

Semiconductor systems are provided. The semiconductor system includes a first semiconductor device and a second semiconductor device. The first semiconductor device generates an input calibration signal during a mode register write operation and receives an output data and an output calibration signal to control a recognition point of a logic level of the output data according to a delay time of the output calibration signal during a read operation. The second semiconductor device stores the input calibration signal therein during the mode register write operation and outputs the output calibration signal and the output data during the read operation.

18 Claims, 8 Drawing Sheets

FIG. 4

| TS<1> | TS<2> | TS<3> | SEL<1> | SEL<2> | SEL<3> | SEL<4> |
|---|---|---|---|---|---|---|
| H | H | H | H | L | L | L |
| L | H | H | L | H | L | L |
| L | L | H | L | L | H | L |
| L | L | L | L | L | L | H |

SEMICONDUCTOR DEVICES, SEMICONDUCTOR SYSTEMS INCLUDING THE SAME, AND METHODS OF INPUTTING DATA INTO THE SAME

CROSS-REFERENCE TO RELATED APPLICATION

The present application claims priority under 35 U.S.C. 119(a) to Korean Application No. 10-2013-0097291, filed on Aug. 16, 2013, in the Korean Intellectual Property Office, which is incorporated herein by reference in its entirety as set forth in full.

BACKGROUND

1. Technical Field

Embodiments of the present disclosure relate to semiconductor devices, semiconductor systems including the same, and methods of inputting data into the same.

2. Related Art

Fast semiconductor systems with high integration density are increasingly in demand. Semiconductor devices sometimes operate synchronously with external clock signals to improve the operation speed thereof. Synchronous semiconductor devices, for example, double data rate (DDR) devices, may successively receive or output a couple data units of through each data input/output (I/O) pin. The data may be output each cycle of the external clock signal synchronized with every rising edge and every falling edge of the external clock signal.

Semiconductor systems may execute a read training operation for removing a skew between a data signal and a clock signal. The read training operation may be executed using a test that removes the skew between the data signal and the clock signal. The skew may be removed by controlling an input/output (I/O) timing of data according to a characteristic of a channel through which data is inputted or outputted.

Semiconductor systems may be placed in a separate test mode aside from the normal test mode, when executing the read training operation. In such a case, however, time for executing a read operation and a write operation corresponding to inherent operations of the semiconductor systems may be reduced to lower an efficiency of the semiconductor systems.

SUMMARY

Various embodiments are directed to semiconductor devices, semiconductor systems including the same, and methods of inputting data into the same.

According to some embodiments, a semiconductor system includes a first semiconductor device and a second semiconductor device. The first semiconductor device generates an input calibration signal during a mode register write operation and receives an output data and an output calibration signal to control a recognition point of a logic level of the output data according to a delay time of the output calibration signal during a read operation. The second semiconductor device stores the input calibration signal therein during the mode register write operation and outputs the output calibration signal and the output data during the read operation.

According to further embodiments, a semiconductor device includes a command generator suitable for generating a command signal having a first logic level combination in a mode register write operation and suitable for generating the command signal having a second logic level combination in a read operation, a monitoring signal generator suitable for generating a monitoring signal enabled after a predetermined time from the start of the read operation, an input strobe signal generator suitable for comparing times when the monitoring signal transitions logic levels with times when an internal calibration signal transitions logic levels to generate an input strobe signal, and a data input unit suitable for outputting an output calibration signal supplied from an external device as the internal calibration signal and suitable for receiving the input strobe signal to generate an internal data according to a logic level of an output data supplied from the external device.

According to further embodiments, a method of inputting data into a semiconductor device includes generating an input calibration signal in a mode register write operation, generating an input strobe signal by controlling a delay time of a strobe signal according to a delay time of an output calibration signal obtained from the input calibration signal in a read operation, and controlling a recognition point of a logic level of an output data in response to the input strobe signal as part of the read operation. The output calibration signal and the output data are simultaneously generated. The output calibration signal is generated when a predetermined time elapses from the start of the read operation.

BRIEF DESCRIPTION OF THE DRAWINGS

Embodiments of the present invention will become more apparent in view of the attached drawings and accompanying detailed description, in which:

FIG. 4 is a logic table illustrating an operation of a transmission signal generator and a selection signal generator included in the input strobe signal generator of FIG. 3;

DETAILED DESCRIPTION OF THE EMBODIMENTS

Embodiments of the present invention will be described hereinafter with reference to the accompanying drawings. However, the embodiments described herein are for illustrative purposes only and are not intended to limit the scope of the invention.

Figure 1:
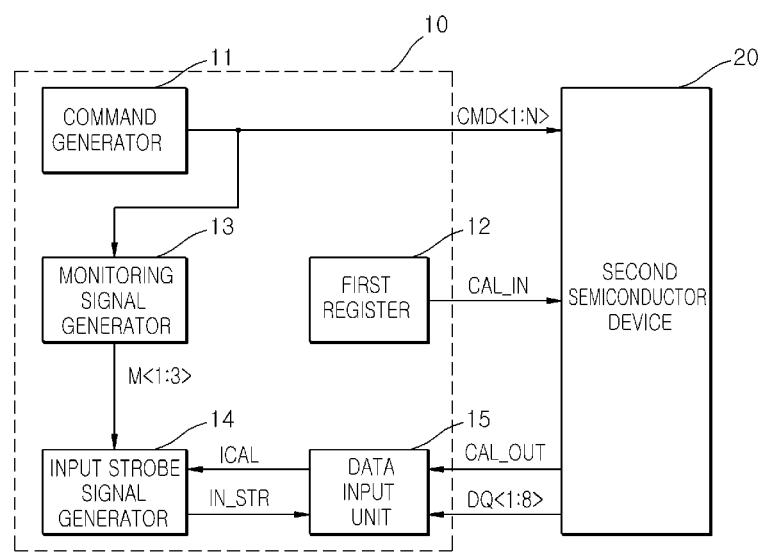
FIG. 1 is a block diagram illustrating a semiconductor system according to an embodiment of the present disclosure.

Referring to FIG. 1, a semiconductor system according to an embodiment may include a first semiconductor device 10 and a second semiconductor device 20.

The first semiconductor device 10 may generate an input calibration signal CAL_IN and may apply the input calibration signal CAL_IN to the second semiconductor device 20 during a mode register write operation. Further, the first semiconductor device 10 may receive an output calibration signal CAL_OUT and first to eighth output data DQ<1:8> from the second semiconductor device 20 to control points of time that recognizes levels of the first to eighth output data DQ<1:8> according to a delay time of the output calibration signal CAL_OUT during a read operation. In other words, in one embodiment, the delay time of the output calibration signal CAL_OUT may correspond to a time interval associated with a start time of a read operation and a moment when an output calibration signal changes logic levels. In some embodiments, the first semiconductor device 10 may correspond to a controller or an external system that controls an operation of the second semiconductor device 20. In addition, the output calibration signal CAL_OUT and the first to eighth output data DQ<1:8> may be simultaneously inputted to the first semiconductor device 10 as part of a read operation.

The second semiconductor device 20 may store the input calibration signal CAL_IN therein in the mode register write operation and may output the output calibration signal CAL_OUT and the first to eighth output data DQ<1:8> during the read operation. In one embodiment, the output calibration signal CAL_OUT may be inputted to the first semiconductor device 10 when a predetermined time elapses after a start of a read operation.

A configuration of the first semiconductor device 10 will be described more fully hereinafter.

The first semiconductor device 10 may be suitable for including a command generator 11, a first register 12, a monitoring signal generator 13, an input strobe signal generator 14, and a data input unit 15. The command generator 11 may generate a command signal CMD<1:N> having a first logic level combination for the mode register write operation, and the command signal CMD<1:N> having a second logic level combination for the read operation. The first register 12 may generate the input calibration signal CAL_IN having a predetermined logic level during a mode register write operation. The monitoring signal generator 13 may generate first, second and third monitoring signals M<1:3> which are sequentially enabled a predetermined time from when a read operation starts. The data input unit 15 may generate the internal calibration signal ICAL from the output calibration signal CAL_OUT. The input strobe signal generator 14 may compare times when the first to third monitoring signals M<1:3> transitions from one logic level to a next logic level, with a time that the internal calibration signal ICAL transitions from one logic level to a next logic level to generate an input strobe signal IN_STR. The data input unit 15 may recognize logic levels of the first to eighth output data DQ<1:8> synchronized with the input strobe signal IN_STR. Further, the data input unit 15 may be suitable for receiving the input strobe signal IN_STR and generate internal data according to the logic levels of the first to eighth output data DQ<1:8>.

A configuration of the monitoring signal generator 13 will be described more fully hereinafter with reference to FIG. 2.

Figure 2:
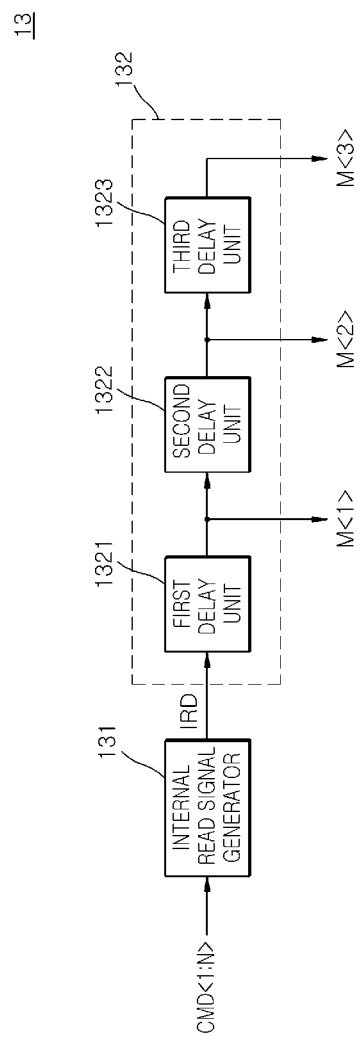
FIG. 2 is a block diagram illustrating a monitoring signal generator included in the semiconductor system of FIG. 1.

Referring to FIG. 2, the monitoring signal generator 13 may include an internal read signal generator 131 and a delay unit 132. The internal read signal generator 131 may generate an internal read signal IRD including a pulse which is created after a predetermined time from the start of a read operation. A read operation may start when the command signal CMD<1:N> having the second logic level combination is inputted for the read operation. The delay unit 132 may delay the internal read signal IRD to generate the first to third monitoring signals M<1:3>. The delay unit 132 may include a first delay unit 1321 suitable for delaying the internal read signal IRD to generate the first monitoring signal M<1>, a second delay unit 1322 suitable for delaying the first monitoring signal M<1> to generate the second monitoring signal M<2>, and a third delay unit 1323 suitable for delaying the second monitoring signal M<2> to generate the third monitoring signal M<3>.

A configuration of the input strobe signal generator 14 will be described more fully hereinafter with reference to FIG. 3.

Figure 3:
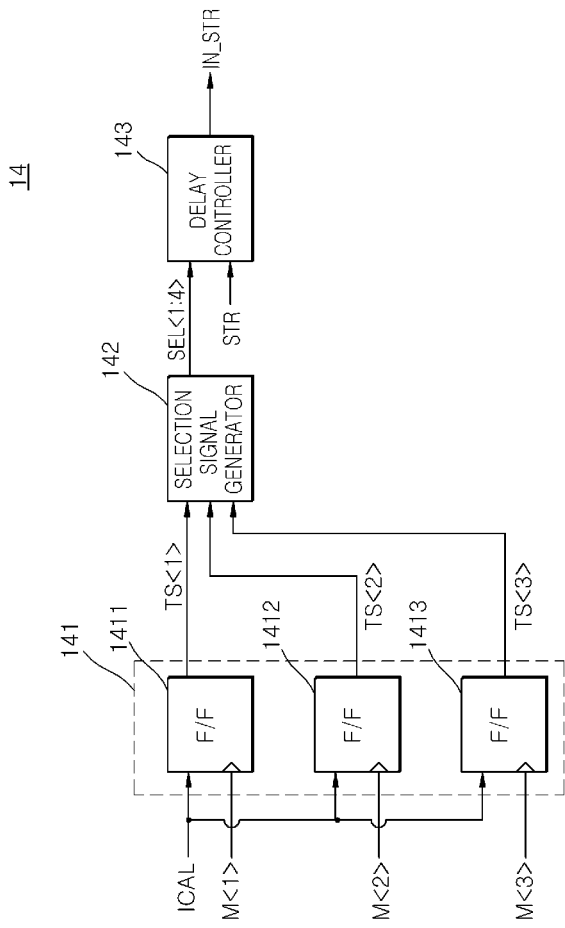
FIG. 3 is a block diagram illustrating an input strobe signal generator included in the semiconductor system of FIG. 1.

Referring to FIG. 3, the input strobe signal generator 14 may include a transmission signal generator 141, a selection signal generator 142, and a delay controller 143. The transmission signal generator 141 may output the internal calibration signal ICAL as first to third transmission signals TS<1:3> when the first to third monitoring signals M<1:3> transitions from one logic level to a next logic level. In one example, the transmission signal generator 141 may output the internal calibration signal ICAL as first to third transmission signals TS<1:3> synchronized with the rising edge of the first to third monitoring signals M<1:3>. The selection signal generator 142 may generate first to fourth selection signals SEL<1:4>, one of which is selectively enabled according to a logic level combination of the first to third transmission signals TS<1:3>. The delay controller 143 may generate the input strobe signal IN_STR by delaying a strobe signal STR for a delay time. The delay time is controlled according to the first to fourth selection signals SEL<1:4>. The transmission signal generator 141 may be suitable for including a first flip flop 1411 outputting the internal calibration signal ICAL as the first transmission signal TS<1> when the first monitoring signal M<1> transitions logic levels, a second flip flop 1412 outputting the internal calibration signal ICAL as the second transmission signal TS<2> when the second monitoring signal M<2> transitions logic levels, and a third flip flop 1413 outputting the internal calibration signal ICAL as the third transmission signal TS<3> when the third monitoring signal M<3> transitions logic levels. In some embodiments, the selection signal generator 142 may be suitable for such that the first to fourth selection signals SEL<1:4> are generated after the third transmission signal TS<3> is inputted thereto.

Relations between logic level combinations of the first to fourth selection signals SEL<1:4> and logic level combinations of the first to third transmission signal TS<1:3> will be described in more detail hereinafter with respect to a logic table of FIG. 4.

Referring to FIG. 4, when all the first to third transmission signals TS<1:3> have a logic "high(H)" level, only the first selection signal SEL<1> of the first to fourth selection signals SEL<1:4> may be enabled to have a logic "high(H)" level.

When the first transmission signal TS<1> has a logic "low (L)" level and the second and third transmission signals TS<2:3> have a logic "high(H)" level, only the second selection signal SEL<2> of the first to fourth selection signals SEL<1:4> may be enabled to have a logic "high(H)" level.

When the first and second transmission signals TS<1:2> have a logic "low(L)" level and the third transmission signal TS<3> has a logic "high(H)" level, only the third selection signal SEL<3> of the first to fourth selection signals SEL<1:4> may be selectively enabled to have a logic "high (H)" level.

When all the first to third transmission signals TS<1:3> have a logic "low(L)" level, only the fourth selection signal SEL<4> of the first to fourth selection signals SEL<1:4> may be selectively enabled to have a logic "high(H)" level.

A configuration of the delay controller 143 will be described more fully hereinafter with reference to FIG. 5.

Figure 5:
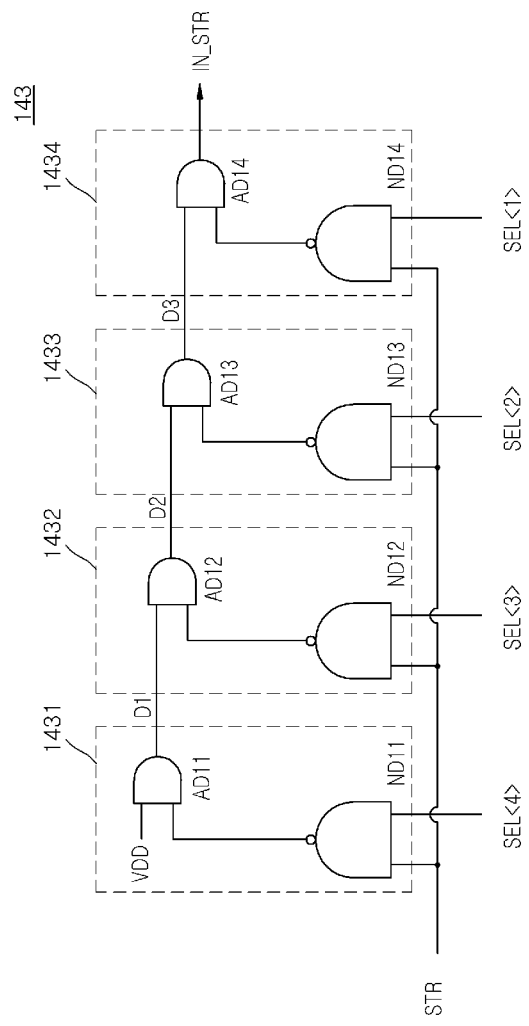
FIG. 5 is a circuit diagram illustrating a delay controller included in the input strobe signal generator of FIG. 3.

Referring to FIG. 5, the delay controller 143 may include a first delay controller 1431, a second delay controller 1432, a third delay controller 1433 and a fourth delay controller 1434. The first delay controller 1431 may include a NAND gate ND11 suitable for receiving the fourth selection signal SEL<4> and the strobe signal STR. The first delay controller 1431 may also include an AND gate AD11 suitable for buffering an output signal of the NAND gate ND11 in response to a power voltage signal VDD to generate a first delayed signal D1. The second delay controller 1432 may include a NAND gate ND12 suitable for receiving the third selection signal SEL<3> and the strobe signal STR. The second delay controller 1432 may also include an AND gate AD12 suitable for buffering an output signal of the NAND gate ND12 in response to the first delayed signal D1 to generate a second delayed signal D2. The third delay controller 1433 may include a NAND gate ND13 suitable for receiving the second selection signal SEL<2> and the strobe signal STR. The third delay controller 1433 may also include an AND gate AD13 suitable for buffering an output signal of the NAND gate ND13 in response to the second delayed signal D2 to generate a third delayed signal D3. The fourth delay controller 1434 may include a NAND gate ND14 suitable for receiving the first selection signal SEL<1> and the strobe signal STR. The fourth delay controller 1434 may also include an AND gate AD14 suitable for buffering an output signal of the NAND gate ND14 in response to the third delayed signal D3 to generate the input strobe signal IN_STR.

An operation of the delay controller 143 that delays the strobe signal STR for a delay time (where the delay time is set according to a logic level combination of the first to fourth selection signals SEL<1:4>) to generate the input strobe signal IN_STR, will be described more fully hereinafter.

When the fourth selection signal SEL<4> is selectively enabled to have a logic "high" level, the delay controller 143 may generate the input strobe signal IN_STR by delaying the strobe signal STR for a fourth delay time. The fourth delay time may be set according to a logic level combination of the first to fourth selection signals SEL<1:4>. The fourth delay time may be a total delay time of the NAND gate ND11 and the first to fourth AND gates AD11, AD12, AD13 and AD14.

When the third selection signal SEL<3> is selectively enabled to have a logic "high" level, the delay controller 143 may generate the input strobe signal IN_STR by delaying the strobe signal STR for a third delay time. The third delay time may be set according to a logic level combination of the first to fourth selection signals SEL<1:4>. The third delay time may be a total delay time of the NAND gate ND12 and the second to fourth AND gates AD12, AD13 and AD14.

When the second selection signal SEL<2> is selectively enabled to have a logic "high" level, the delay controller 143 may generate the input strobe signal IN_STR by delaying the strobe signal STR for a second delay time. The second delay time may be set according to a logic level combination of the first to fourth selection signals SEL<1:4>. The second delay time may be a total delay time of the NAND gate ND13 and the third and fourth AND gates AD13 and AD14.

When the first selection signal SEL<1> is selectively enabled to have a logic "high" level, the delay controller 143 may generate the input strobe signal IN_STR by delaying the strobe signal STR for a first delay time. The first delay time may be set according to a logic level combination of the first to fourth selection signals SEL<1:4>. The first delay time may be a total delay time of the NAND gate ND14 and the fourth AND gate AD14.

The first delay time may be less than the second delay time, the second delay time may be less than the third delay time. In addition, the third delay time may be less than the fourth delay time. Further, the NAND gates ND11, ND12, ND13 and ND14 may suitable for cause a same delay time, and the AND gates AD11, AD12, AD13 and AD14 may also be suitable for cause a same delay time.

A configuration of the data input unit 15 will be described more fully hereinafter with respect to FIG. 6.

Figure 6:
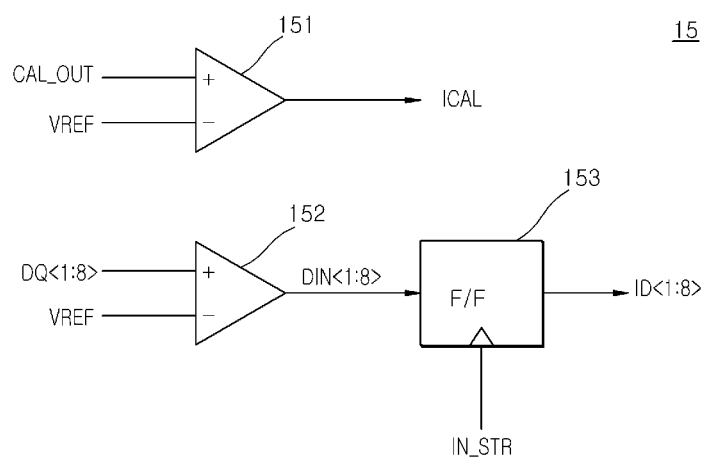
FIG. 6 is a block diagram illustrating a data input unit included in the semiconductor system of FIG. 1.

Referring to FIG. 6, the data input unit 15 may include a first comparator 151 that compares the output calibration signal CAL_OUT with a reference voltage signal VREF to generate the internal calibration signal ICAL, a second comparator 152 that compares the first to eighth output data DQ<1:8> with the reference voltage signal VREF to generate first to eighth input data DIN<1:8>, and a fourth flip flop 153 that outputs the first to eighth input data DIN<1:8> as first to eighth internal data ID<1:8> synchronized with the input strobe signal IN_STR.

A configuration of the second semiconductor device 20 will be described more fully hereinafter with respect to FIG. 7.

Figure 7:
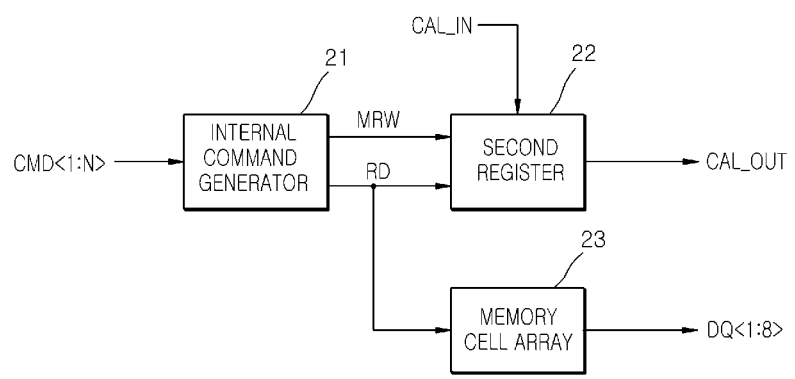
FIG. 7 is a block diagram illustrating a second semiconductor device included in the semiconductor system of FIG. 1.

Referring to FIG. 7, the second semiconductor device 20 may include an internal command generator 21, a second register 22 and a memory cell array 23. The internal command generator 21 may generate a first internal command signal MRW for the mode register write operation when the command signal CMD<1:N> having a first logic level combination is inputted thereto. The internal command generator 21 may generate a second internal command signal RD for the read operation when the command signal CMD<1:N> having a second logic level combination is inputted thereto. The second register 22 may store the input calibration signal CAL_IN therein when the first internal command signal MRW is inputted thereto and may output the stored input calibration signal CAL_IN as the output calibration signal CAL_OUT when the second internal command signal RD is inputted thereto. The memory cell array 23 may output the data stored in memory cells thereof as the first to eighth output data DQ<1:8> when the second internal command signal RD is inputted thereto.

Figure 8:
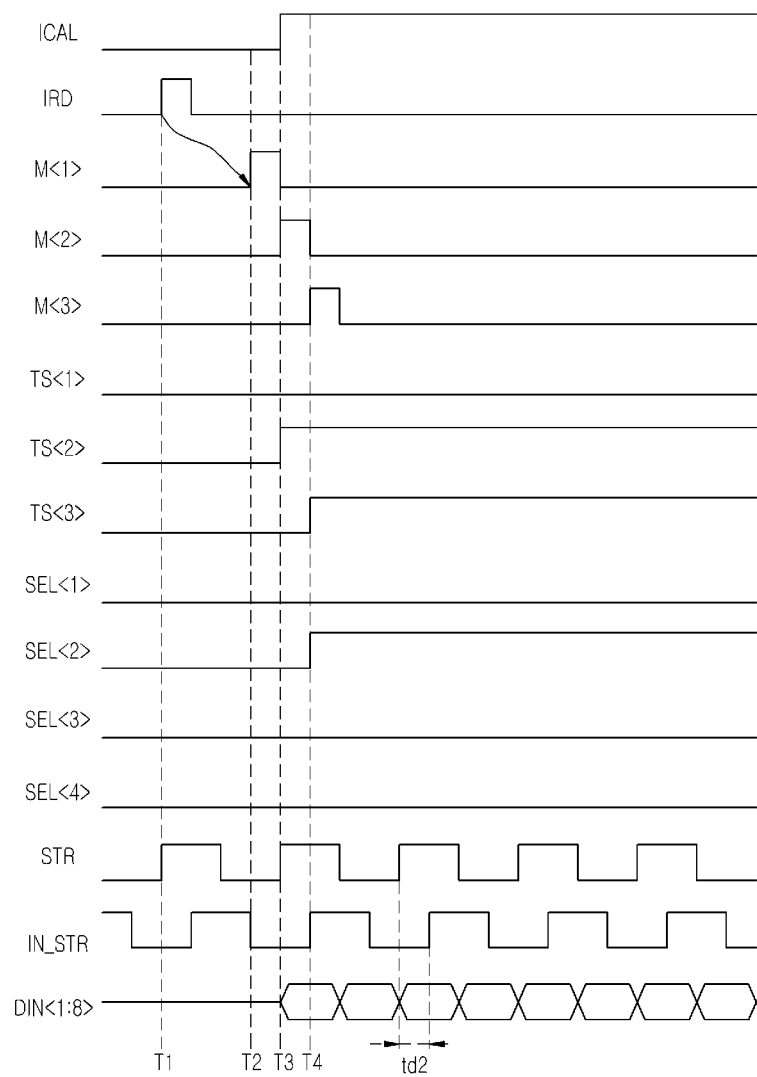
FIG. 8 is a timing diagram illustrating an operation of a semiconductor system according to an embodiment of the present invention.

An operation of the semiconductor system set forth above will be described hereinafter with reference to FIG. 8 in conjunction with an example where the first to eighth output data DQ<1:8> are delayed for the second delay time during a read operation. That is, in this example scenario the input calibration signal CAL_IN is delayed for the second delay time to control a recognition point of the first to eighth output data DQ<1:8>.

At time "T1", the internal read signal generator 131 may generate the internal read signal IRD which may be enabled after a predetermined time from the start of a read operation.

At time "T2", the delay unit 132 may delay the internal read signal IRD to generate the first monitoring signal M<1>. The transmission signal generator 141 may output the internal calibration signal ICAL as the first transmission signal TS<1> when a level of the first monitoring signal M<1> changes from a logic "low" level to a logic "high" level. As a result, the first transmission signal TS<1> may be generated to have a logic "low" level at time "T2".

At time "T3", the data input unit 15 may receive the output calibration signal CAL_OUT to generate the internal calibration signal ICAL having a logic "high" level. The data input unit 15 may also receive the first to eighth output data DQ<1:8> to generate the first to eighth input data DIN<1:8>. The delay unit 132 may delay the first monitoring signal M<1> to generate the second monitoring signal M<2>. The transmission signal generator 141 may output the internal calibration signal ICAL as the second transmission signal TS<2> when a level of the second monitoring signal M<2> changes from a logic "low" level to a logic "high" level. As a result, the second transmission signal TS<2> may be generated to have a logic "high" level at time "T3".

At time "T4", the delay unit 132 may delay the second monitoring signal M<2> to generate the third monitoring signal M<3>. The transmission signal generator 141 may output the internal calibration signal ICAL as the third transmission signal TS<3> when a level of the third monitoring signal M<3> changes from a logic "low" level to a logic "high" level. As a result, the third transmission signal TS<3> may be generated to have a logic "high" level at time "T4". Because the first transmission signal TS<1> has a logic "low" level and the second and third transmission signals TS<2:3> have a logic "high" level, the selection signal generator 142 may generate the first to fourth selection signals SEL<1:4> such that only the second selection signal SEL<2> is enabled to have a logic "high" level. In response to the second selection signal SEL<2> having a logic "high" level, the delay controller 143 may delay the strobe signal STR for the second delay time TD2 to generate the input strobe signal IN_STR.

The data input unit 15 may receive first to eighth output data DQ<1:8> to generate the first to eighth input data DIN<1:8> and to generate the first to eighth internal data ID<1:8> synchronized with the input strobe signal IN_STR delayed for the second delay time TD2. That is, the data input unit 15 may generate the first to eighth internal data ID<1:8> synchronized with the input strobe signal IN_STR after levels of the first to eighth input data DIN<1:8> are stabilized.

The semiconductor system having the aforementioned configuration output calibration signal CAL_OUT during the read operation and may control a recognition point of the output data DQ<1:8> in connection with the delay time of the output calibration signal CAL_OUT. Thus, an operation efficiency of the semiconductor system may be enhanced without use of a separate test mode.

What is claimed is:

1. A semiconductor system comprising:
   a command generator suitable for generating a command signal having a first logic level combination in a mode register write operation and suitable for generating the command signal having a second logic level combination in a read operation;
   a first register suitable for generating a input calibration signal having a predetermined logic level in the mode register write operation;
   a monitoring signal generator suitable for generating a monitoring signal enabled after a predetermined time from a start of the read operation;
   an input strobe signal generator suitable for comparing times when the monitoring signal transitions logic levels with times an internal calibration signal transitions logic levels, where the internal calibration signal is generated from a output calibration signal to generate an input strobe signal;
   a data input unit suitable for outputting the output calibration signal as the internal calibration signal and suitable for receiving the input strobe signal to generate an internal data according to a logic level of an output data; and
   a second semiconductor device suitable for storing the input calibration signal therein during the mode register write operation and suitable for outputting the output calibration signal and the output data during the read operation.

2. The semiconductor system of claim 1, wherein the delay time of the output calibration signal corresponds to a time associated with an interval between a start time of the read operation and a moment that a logic level of the output calibration signal is changed.

3. The semiconductor system of claim 1,
   wherein the output data and the output calibration signal are simultaneously inputted to the first semiconductor device; and
   wherein the output calibration signal is inputted to the first semiconductor device when a predetermined time elapses from a starting point of the read operation.

4. The semiconductor system of claim 1,
   wherein the monitoring signal includes a first monitoring signal and a second monitoring signal; and
   wherein the monitoring signal generator includes:
   an internal read signal generator suitable for generating an internal read signal including a pulse which is created in response to the command signal having the second logic level combination which is inputted during the read operation; and
   a delay unit suitable for delaying the internal read signal for predetermined periods to generate the first and second monitoring signals.

5. The semiconductor system of claim 4, wherein the input strobe signal generator includes:
   a transmission signal generator suitable for outputting the internal calibration signal as a first transmission signal synchronized with a rising edge of the first monitoring signal and suitable for outputting the internal calibration signal as a second transmission signal synchronized with a rising edge of the second monitoring signal;
   a selection signal generator suitable for generating first to third selection signals, one of which is selectively enabled according to a logic level combination of the first and second transmission signals; and
   a delay controller suitable for generating the input strobe signal obtained by delaying a strobe signal for a delay time which is set according to a logic level combination of the first to third selection signals.

6. The semiconductor system of claim 5, wherein the delay controller includes:
   a first delay controller suitable for be driven in response to a power voltage signal and suitable for delaying the strobe signal to generate a first delayed signal when the third selection signal is enabled;
   a second delay controller suitable for be driven in response to the first delayed signal and suitable for delaying the strobe signal to generate a second delayed signal when the second selection signal is enabled; and
   a third delay controller suitable for be driven in response to the second delayed signal and suitable for delaying the strobe signal to generate the input strobe signal when the first selection signal is enabled.

7. The semiconductor system of claim 6,
   wherein the delay controller is suitable for outputting the input strobe signal obtained by delaying the strobe signal by a third delay time when the third selection signal is selectively enabled;
   wherein the delay controller is suitable for outputting the input strobe signal obtained by delaying the strobe signal for a second delay time when the second selection signal is selectively enabled; and
   wherein the delay controller is suitable for outputting the input strobe signal obtained by delaying the strobe signal for a first delay time when the first selection signal is selectively enabled.

8. The semiconductor system of claim 1, wherein the data input unit includes:
   a first comparator suitable for comparing the output calibration signal with a reference voltage signal to generate the internal calibration signal;

a second comparator suitable for comparing the output data with the reference voltage signal to generate an input data; and a flip flop suitable for outputting the input data as the internal data at a moment that a logic level of the input strobe signal is changed.

9. The semiconductor system of claim 1, wherein the second semiconductor device includes:

an internal command generator suitable for generating a first internal command signal for executing the mode register write operation when the command signal has a first logic level combination and suitable for generating a second internal command signal for executing the read operation when the command signal has a second logic level combination;

a second register suitable for storing the input calibration signal therein in response to the first internal command signal and suitable for outputting the stored input calibration signal as the output calibration signal in response to second internal command signal; and a memory cell array suitable for outputting a data stored in a memory cell thereof as the output data in response to the second internal command signal.

10. A semiconductor device comprising:

a command generator suitable for generating a command signal having a first logic level combination in a mode register write operation and suitable for generating the command signal having a second logic level combination in a read operation;

a monitoring signal generator suitable for generating a monitoring signal enabled after a predetermined time from a the start of the read operation;

an input strobe signal generator suitable for comparing times when the monitoring signal transitions logic levels with times when an internal calibration signal transitions logic levels to generate an input strobe signal; and a data input unit suitable for outputting an output calibration signal supplied from an external device as the internal calibration signal and suitable for receiving the input strobe signal to generate an internal data according to a logic level of an output data supplied from the external device.

11. The semiconductor device of claim 10, wherein the output data and the output calibration signal are simultaneously inputted to the data input unit; and wherein the output calibration signal is inputted to the data input unit when the predetermined time elapses from when the read operation starts.

12. The semiconductor device of claim 10, wherein the monitoring signal includes a first monitoring signal and a second monitoring signal; and wherein the monitoring signal generator includes:

an internal read signal generator suitable for generating an internal read signal including a pulse which is created in response to the command signal having the second logic level combination which is inputted during the read operation; and a delay unit suitable for delaying the internal read signal by predetermined periods to generate the first and second monitoring signals.

13. The semiconductor device of claim 12, wherein the input strobe signal generator includes:

a transmission signal generator suitable for outputting the internal calibration signal as a first transmission signal synchronized with a rising edge of the first monitoring signal and suitable for outputting the internal calibration signal as a second transmission signal synchronized with a rising edge of the second monitoring signal;

a selection signal generator suitable for generating first to third selection signals, one of which is selectively enabled according to a logic level combination of the first and second transmission signals; and a delay controller suitable for generating the input strobe signal obtained by delaying a strobe signal for a delay time which is set according to a logic level combination of the first to third selection signals.

14. The semiconductor device of claim 13, wherein the delay controller includes:

a first delay controller suitable for be driven in response to a power voltage signal and suitable for delaying the strobe signal to generate a first delayed signal when the third selection signal is enabled;

a second delay controller suitable for be driven in response to the first delayed signal and suitable for delaying the strobe signal to generate a second delayed signal when the second selection signal is enabled; and a third delay controller suitable for be driven in response to the second delayed signal and suitable for delaying the strobe signal to generate the input strobe signal when the first selection signal is enabled.

15. The semiconductor device of claim 13, wherein the delay controller is suitable for outputting the input strobe signal obtained by delaying the strobe signal for a third delay time when the third selection signal is selectively enabled;

wherein the delay controller is suitable for outputting the input strobe signal obtained by delaying the strobe signal for a second delay time when the second selection signal is selectively enabled; and wherein the delay controller is suitable for outputting the input strobe signal obtained by delaying the strobe signal for a first delay time when the first selection signal is selectively enabled.

16. The semiconductor device of claim 10, wherein the data input unit includes:

a first comparator suitable for comparing the output calibration signal with a reference voltage signal to generate the internal calibration signal;

a second comparator suitable for comparing the output data with the reference voltage signal to generate an input data; and a flip flop suitable for outputting the input data as the internal data at a moment that a logic level of the input strobe signal is changed.

17. A method of inputting a data into a semiconductor device, the method comprising:

a) generating an input calibration signal in a mode register write operation;

b) generating an input strobe signal by controlling a delay time of a strobe signal according to a delay time of an output calibration signal obtained from the input calibration signal in a read operation; and c) controlling a recognition point of an output data logic level in response to the input strobe signal in the read operation, wherein the output calibration signal and the output data are simultaneously generated, and wherein the output calibration signal is generated when a predetermined time elapses from a start of the read operation; and wherein the step b) generates the input strobe signal by comparing when the output calibration signal transitions logic levels with when a monitoring signal transitions logic levels, where the monitoring signal is enabled after the predetermined time from the start of the read operation.

18. The method of claim 17, wherein the step c) generates an internal data from the output data synchronized with when the input strobe signal transitions logic levels.

* * * * *